United States Patent
Hill et al.

(10) Patent No.: US 9,952,577 B2
(45) Date of Patent: Apr. 24, 2018

(54) GRAPH THEORY AND NETWORK ANALYTICS AND DIAGNOSTICS FOR PROCESS OPTIMIZATION IN MANUFACTURING

(71) Applicant: Dell Software, Inc., Round Rock, TX (US)

(72) Inventors: Thomas Hill, Tulsa, OK (US); Pawel Lewicki, Tulsa, OK (US)

(73) Assignee: TIBCO Software Inc., Palo Alto, CA (US)

( * ) Notice: Subject to any disclaimer, the term of this patent is extended or adjusted under 35 U.S.C. 154(b) by 449 days.

(21) Appl. No.: 14/690,600

(22) Filed: Apr. 20, 2015

(65) Prior Publication Data

US 2016/0306332 A1 Oct. 20, 2016

(51) Int. Cl.
| | |
|---|---|
| G06F 17/00 | (2006.01) |
| G06F 17/10 | (2006.01) |
| G05B 19/042 | (2006.01) |
| G05B 15/02 | (2006.01) |
| G06F 17/50 | (2006.01) |
| G06Q 10/06 | (2012.01) |
| G06Q 50/04 | (2012.01) |

(52) U.S. Cl.
CPC ........ G05B 19/0426 (2013.01); G05B 15/02 (2013.01); *G05B 2219/25064* (2013.01); *G06F 17/10* (2013.01); *G06F 17/50* (2013.01); *G06F 17/509* (2013.01); *G06Q 10/06* (2013.01); *G06Q 50/04* (2013.01)

(58) Field of Classification Search
CPC ........ G06F 17/10; G06F 17/50; G06F 17/509; G06Q 10/06; G06Q 10/0833; G06Q 10/06395; G06Q 50/04
USPC .............. 700/106, 108, 26, 30, 97
See application file for complete search history.

(56) References Cited

U.S. PATENT DOCUMENTS

2005/0192783 A1* 9/2005 Lystad ............ G06Q 10/06312
703/3

* cited by examiner

*Primary Examiner* — Michael J Brown
(74) *Attorney, Agent, or Firm* — Baker & McKenzie LLP

(57) ABSTRACT

A system, method, and computer-readable medium are disclosed for analysis and characterization of manufacturing information such as process trees or genealogies using graph theory. More specifically, using graph theory to analyze manufacturing information of a manufacturing operation allows for deep analysis of relationships between batches or units in a process tree and their closeness or distance, to identify clusters associated with specific quality characteristics or problems, to identify common antecedents of specifically labeled batches (e.g., problem batches), and/or to detect overall desirable or undesirable characteristics of the process tree (e.g., centrality, etc.).

19 Claims, 4 Drawing Sheets

GRAPH THEORY AND NETWORK ANALYTICS AND DIAGNOSTICS FOR PROCESS OPTIMIZATION IN MANUFACTURING

BACKGROUND OF THE INVENTION

Field of the Invention

The present invention relates to information handling systems. More specifically, embodiments of the invention relate to using graph theory and network analytics and diagnostics for process optimization in manufacturing.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, global communications, manufacturing, or process control. In addition, information handling systems may include a variety of hardware and software components that may be configured to process, store, and communicate information and may include one or more computer systems, data storage systems, and networking systems.

It is known to analyze or control manufacturing operations using information handling systems. An issue in manufacturing operations is the difficulty of tracking manufacturing information such as the genealogy of parts or batches through consecutive processing steps. For example, a common application for root cause and failure analysis in batch manufacturing operations, which are often used when manufacturing pharmaceuticals, is to track the genealogy of batches through the process tree. Usually, such process trees include multiple processing steps where multiple input batches upstream can combine into single batches or containers downstream and single input batches upstream can split into multiple output batches or containers downstream. Process trees may also include branches that connect back to upstream batches or processing steps, e.g., to support rework.

When such processes include relatively large numbers of processing steps and individual input batches, parts, or suppliers (e.g., 40 processing steps and hundreds of batches and hundreds of suppliers, supplying material flowing through the processing steps), complex process trees emerge defining the degree to which each batch is related to other batches through common antecedents or ancestors upstream or off-springs downstream in the process tree. Tracking manufacturing information such as quality measurements, concentrations of chemicals and active ingredients, or to compute statistics centered at a particular process step (also called "unit operation") for measurements or attributes observed upstream or downstream presents mostly a data management challenge.

Many process monitoring and root cause analysis around batch and other multi-step manufacturing processes typically rely on aggregation of measurements upstream and sometimes downstream at a particular process step (i.e., a unit operation), with the goal to perform meaningful statistical process control, comparisons between good and bad batches, etc.

SUMMARY OF THE INVENTION

A system, method, and computer-readable medium are disclosed for analysis and characterization of manufacturing information such as process trees or genealogies using graph theory. More specifically, using graph theory to analyze manufacturing information of a manufacturing operation allows for deep analysis of relationships between batches or units in a process tree and their closeness or distance, to identify clusters associated with specific quality characteristics or problems, to identify common antecedents of specifically labeled batches (e.g., problem batches), and/or to detect overall desirable or undesirable characteristics of the process tree (e.g., centrality, etc.).

More specifically, when using graph theory to analyze and characterize manufacturing information, each unit operation or process step of the manufacturing operation is characterized as a node in a manufacturing operation network representation which is organized using graph theory. In certain embodiments, process inputs such as batches of materials, suppliers, raw materials, etc. are also characterized as nodes in the manufacturing operation network. The process flow of items such as material and batches or parts from suppliers through the steps of the manufacturing operation are characterized as connections (i.e., edges) within the manufacturing operation network representation. In certain embodiments, the connections include uni-directional connections that define the flow of batches. Additionally, in certain embodiments, the connections identify relationships of the items through common antecedents upstream and siblings downstream. Additionally, in certain embodiments, bi-directional flows (which occur in certain manufacturing operations) are identified as bi-directional relations.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
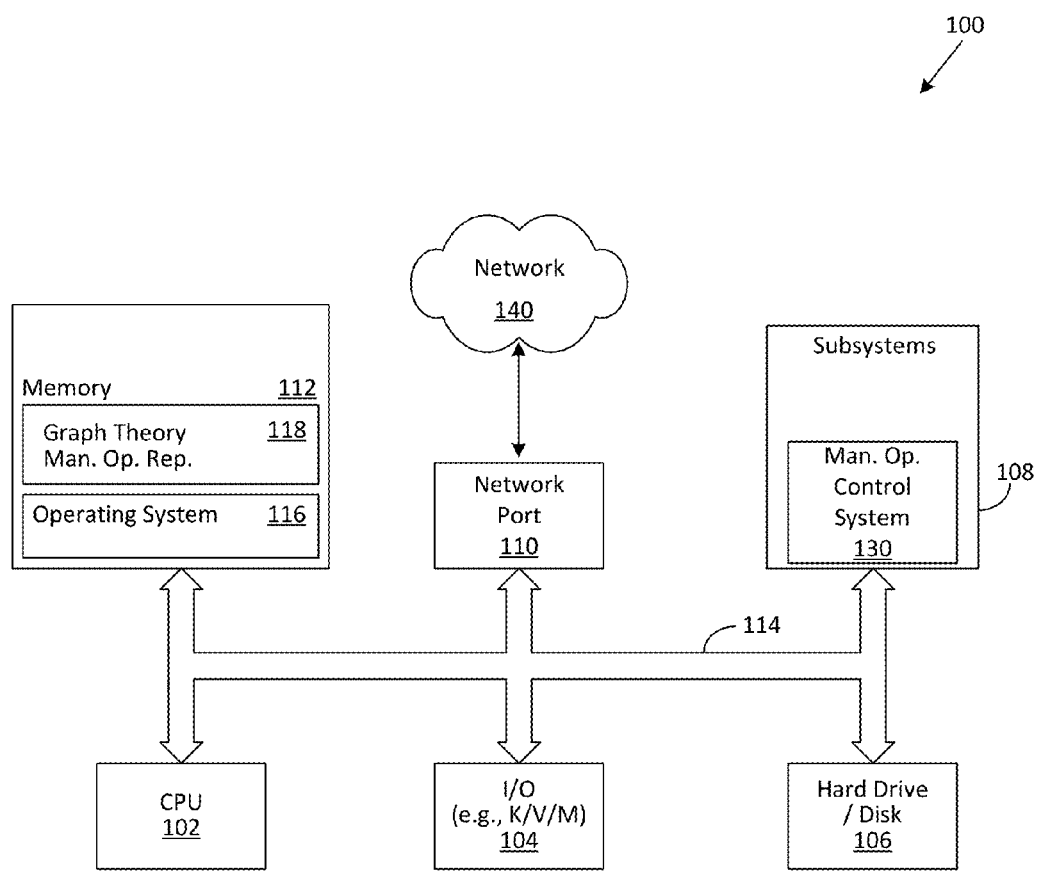
FIG. 1 shows a general illustration of components of an information handling system as implemented in the system and method of the present invention.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise a graph theory manufacturing operation representation module 118. Also, in certain embodiments, the subsystems 118 include a manufacturing operations control system 130.

The graph theory manufacturing operation representation module 118 facilitates analysis and characterization of manufacturing information such as process trees or genealogies using graph theory. More specifically, using graph theory to analyze manufacturing information of a manufacturing operation allows for deep analysis of relationships between batches or units in a process tree and their closeness or distance, to identify clusters associated with specific quality characteristics or problems, to identify common antecedents of specifically labeled batches (e.g., problem batches), and/or to detect overall desirable or undesirable characteristics of the process tree (e.g., centrality, etc.).

Additionally, when using graph theory to analyze and characterize manufacturing information, each unit operation or process step of the manufacturing operation is characterized as a node in a manufacturing operation network representation which is organized using graph theory. Process inputs such as batches of materials, suppliers, raw materials, etc. are also characterized as nodes in the manufacturing operation network. The process flow of items such as material and batches through the steps of the manufacturing operation are characterized as connections (i.e., edges) within the manufacturing operation network representation. The connections include uni-directional connections that define the flow of batches. Additionally, the connections identify relationships of the items through common antecedents upstream and siblings downstream. Additionally, bi-directional flows (which occur in certain manufacturing operations) are identified as bi-directional relations.

Figure 2:
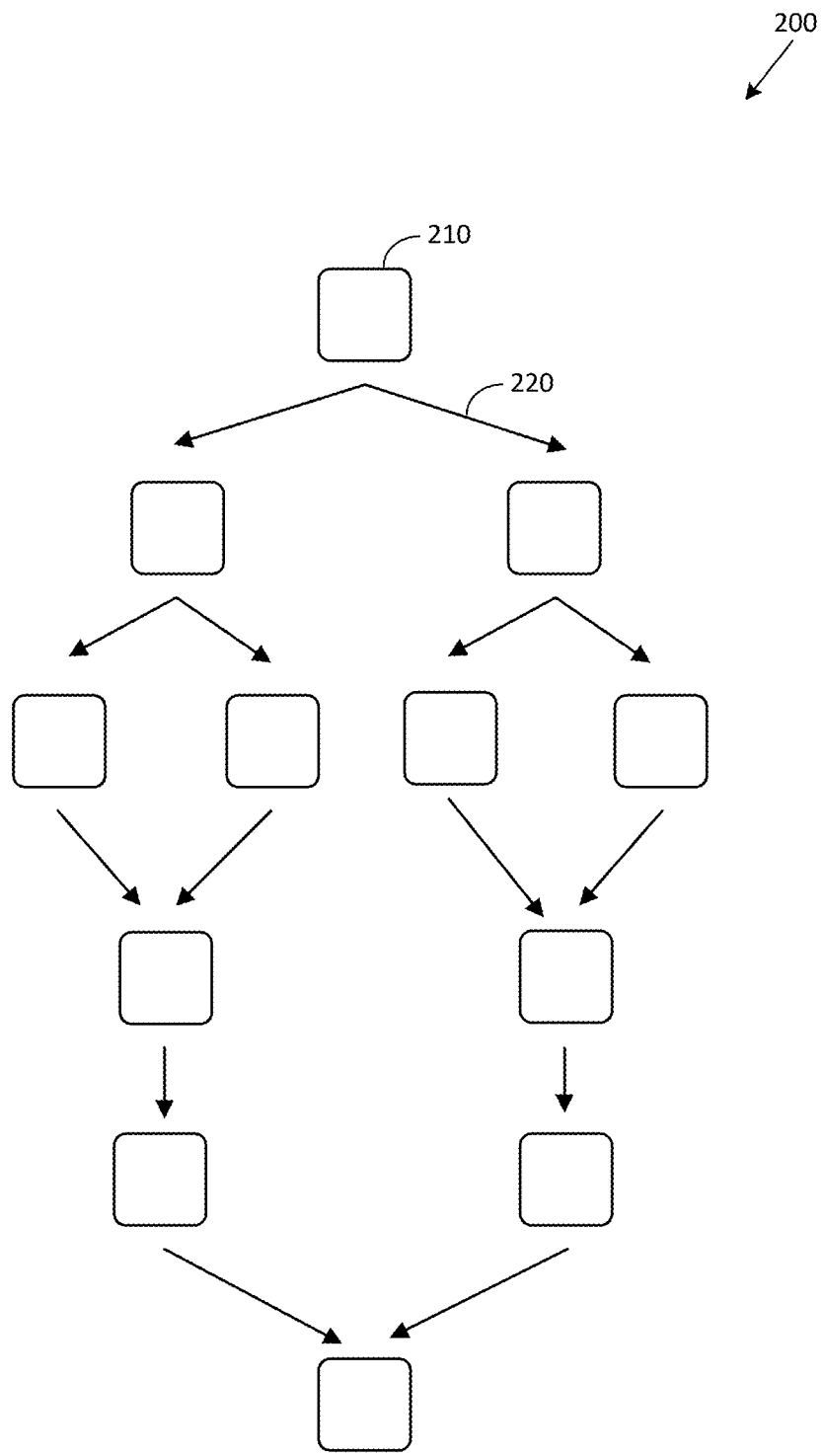
FIG. 2 shows a block diagram of an example process tree of a manufacturing operation.

Referring to FIG. 2, a block diagram of an example process tree 200 of a manufacturing operation is shown. More specifically, the manufacturing operation includes manufacturing units (which may include manufacturing batches) as well as a manufacturing process flow among the manufacturing units. Each manufacturing unit is represented in the process tree 200 as a unit block 210 and each step of the process flow is represented in the process tree 200 as a process flow line 220.

Each manufacturing unit may include a plurality of manufacturing components as well as a plurality of manufacturing operations. For example, in pharmaceutical manufacturing, chemicals and biological agents are often combined into batches that are processed through multiple mixing, fermentation, drying, granulation, and other processing steps; in that process, batches may be split or split batches be combined to form new batches, creating complex relationships between batches at each unit operation through common raw-materials and antecedent and subsequent specific processing steps. In the manufacture of information handling systems such as portable information handling systems, multiple components from different suppliers are combined into different lots of different types of information handling systems through numerous automated manufacturing operation steps. Additionally, the manufacturing process flow may include uni-directional flow as well as bi-directional flow. For example, certain batches or components may not meet quality standards during intermediate testing at a particular unit operation, and the batches or components may be recycled to be used again as inputs into antecedent process steps (a process commonly known as "rework" throughout manufacturing).

Figure 3:
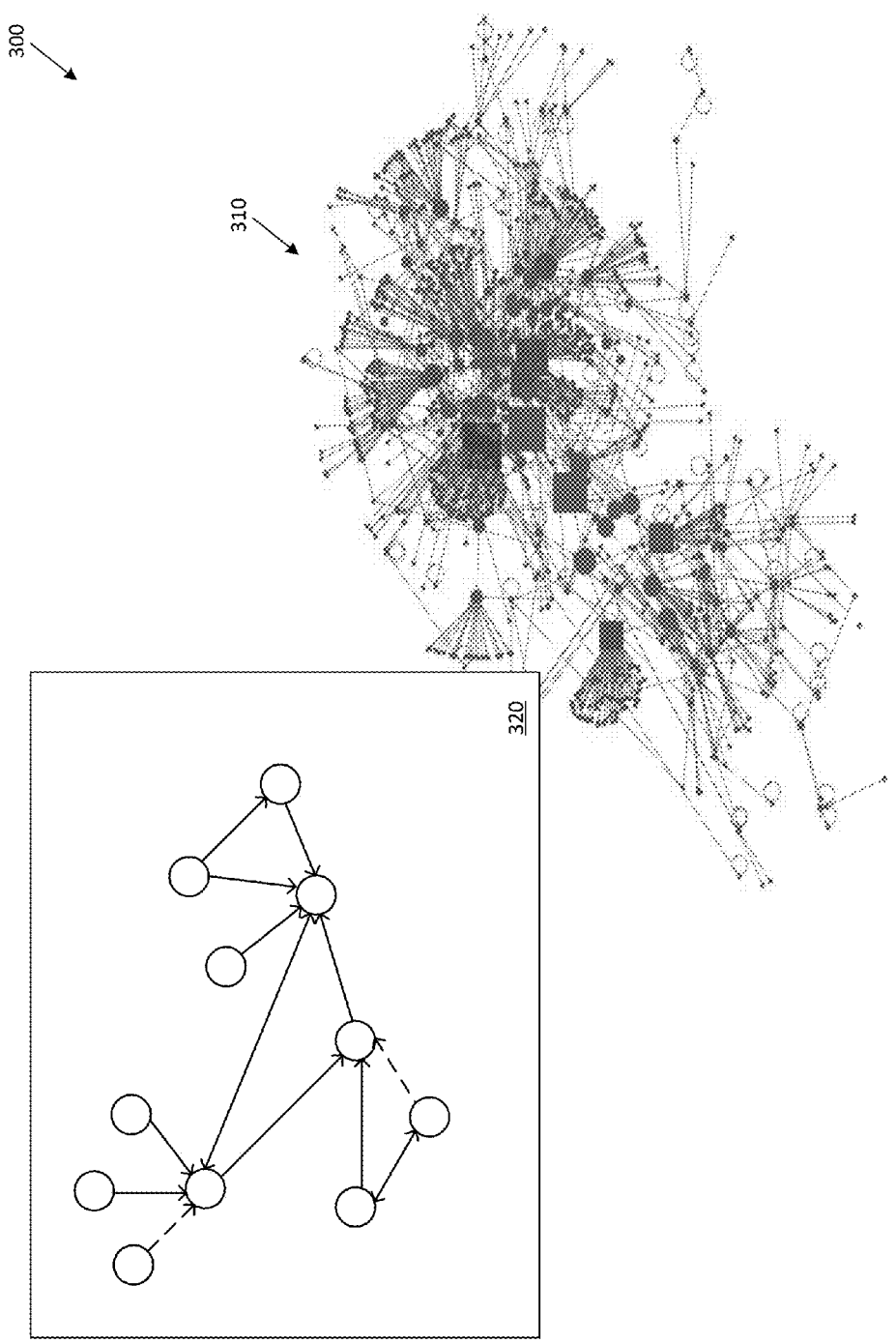
FIG. 3 shows a block diagram of a manufacturing operation network representation of a manufacturing operation.

FIG. 3 shows a block diagram of a manufacturing operation network representation 300 of a manufacturing operation. The manufacturing operation network representation 300 includes a manufacturing operation graph 310. For the purposes of illustration, FIG. 3 shows a simplified, diagrammatic portion 320, which represents a subset of the overall manufacturing operation graph 310.

The graph theory manufacturing operation representation module 118 uses graph theory to represent manufacturing operations and to analyze and characterize manufacturing information such as process trees or genealogies. More specifically, using graph theory to analyze manufacturing information of a manufacturing operation allows for deep analysis of relationships between batches or units in a process tree and their closeness or distance, to identify clusters associated with specific quality characteristics or problems, to identify common antecedents of specifically labeled batches (e.g., problem batches), and/or to detect overall desirable or undesirable characteristics of the process tree (e.g., centrality, etc.). Any quality characteristic of a manufacturing outcome or product, or any quality characteristic or proxy for a quality characteristic of batches or lots measured at an intermediate processing step can be used to assign properties to the respective lots or batches that were measured. For example, certain lots and batches could be labeled as "insufficient quality." Graph theory and the visual representation of graphs then allows identification of connections between those batches or lots to other batches or lots that were not explicitly measured, and computation of a degree of connectedness and hence likely degree of being similar to certain measured batches or lots. Via this method, quality characteristics for batches or lots that are not explicitly measured could be inferred, through their relation in the graph tree to explicitly measured and labeled batches and lots. In another embodiment, batches or lots could be clustered using graph theory computations, to identify those batches or lots forming clusters of closely connected batches and lots based of shared antecedent batches or lots, common suppliers, or materials. Batches or lots within the same cluster are more closely connected when compared to batches or lots in a different cluster, and any differences between clusters with respect to other properties or characteristics may then be attributable to common antecedent batches, lots, suppliers, or raw materials. In both embodiments, deeper insights into the root causes of quality or other characteristics of the final product will result.

When using graph theory to analyze and characterize manufacturing information, the graph theory manufacturing operation representation module 118 characterizes each unit operation or process step of the manufacturing operation as a node in a manufacturing operation network representation 300. The process flow of items such as material and batches through the steps of the manufacturing operation are characterized as connections (i.e., edges) within the manufacturing operation network representation. The connections include uni-directional connections that define the flow of batches. Additionally, the connections identify relationships of the items through common antecedents upstream and siblings downstream. Additionally, bi-directional flows (which occur in certain manufacturing operations) are identified as bi-directional relations.

For example, in an example where the manufacturing operation is a pharmaceutical manufacturing operation, the different units at each unit operation or process step are represented as nodes in the graph. Process inputs such as batches of materials, suppliers, raw materials, etc. are also characterized as nodes in the manufacturing operation network. The process flow of material and batches through the steps then generates a graph with mostly uni-directional connections (edges) that define the flow of batches and their relationships through common antecedents upstream and siblings downstream.

Figure 4:
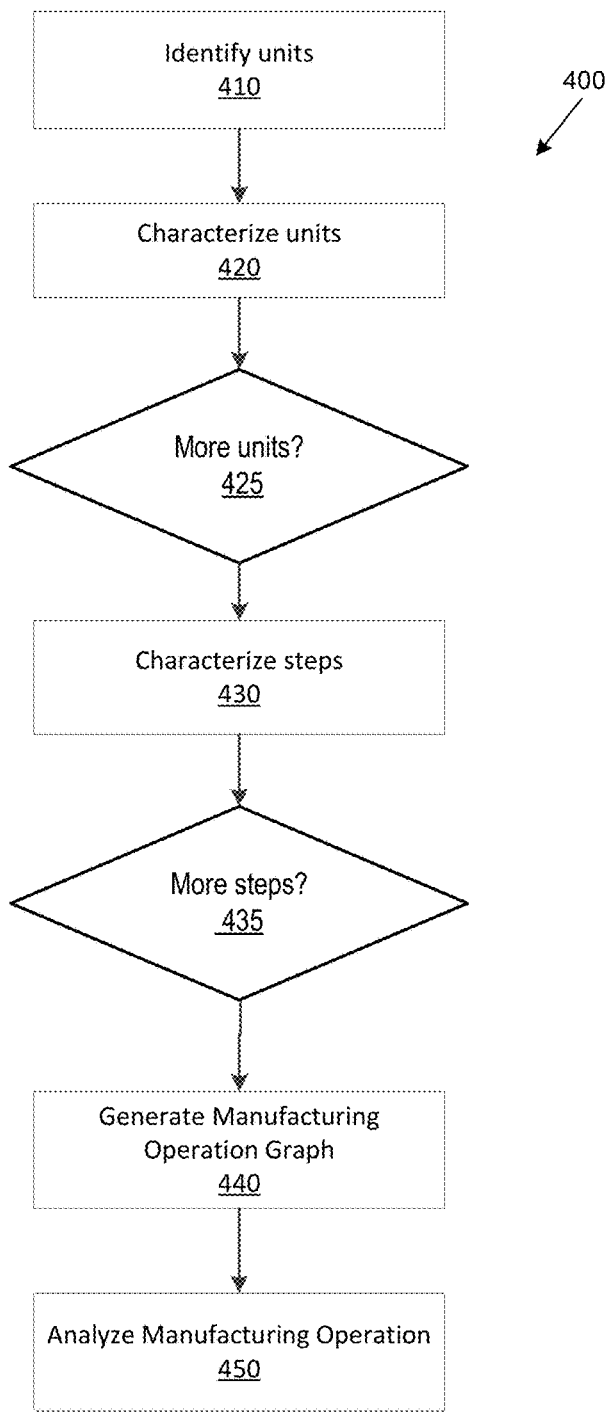
FIG. 4 shows a flow chart of the operation of a graph theory representation system.

FIG. 4 shows a flow chart of the operation of a graph theory manufacturing operation representation system 400. The graph theory manufacturing operation representation module 118 includes modules for performing some or all of the steps of operation of the graph theory manufacturing operation representation system 400.

More specifically, the operation starts by the graph theory manufacturing operation representation system 400 identifying units and steps of a manufacturing operation at step 410, as well as suppliers, batch ID's, input materials, specific processing steps or machines, and other aspects of the manufacturing operation. Next, at step 420, the graph theory manufacturing operation representation system 400 characterizes manufacturing units such as batches or lots as nodes on a manufacturing operation graph representation. Next, at step 425, the graph theory manufacturing operation representation system 400 determines whether there are any more manufacturing units to characterize. If so, then the graph theory manufacturing operation representation system 400 returns to step 420 to characterize the next manufacturing unit. If not, then the graph theory manufacturing operation representation system 400 proceeds to step 430.

At step 430, the graph theory manufacturing operation representation system 400 characterizes steps within the manufacturing system as connections on a manufacturing operation graph representation. Next, at step 435, the graph theory manufacturing operation representation system 400 determines whether there are any more manufacturing connections to characterize. If so, then the graph theory manufacturing operation representation system 400 returns to step 430 to characterize the next manufacturing connection. If not, then the graph theory manufacturing operation representation system 400 proceeds to step 440.

At step 440, the graph theory manufacturing operation representation system 400 generates the manufacturing operation graph representation using the characterized nodes and connections. At step 450, the graph theory manufacturing operation representation system 400 can perform graph theory and network analytics on the manufacturing operation graph representation. The graph theory and network analytics are similar to those applied to analyze and model social networks. Such analyses typically focus on the detection and modeling of influencers and followers, propensity (e.g., fraud, by the degree by which a node or account in a social network is tainted through association with other labeled known-fraud nodes or accounts), clustering and identification of homogeneous sub-networks, or the overall description and characterization of the network (degree of connectedness, density, etc.).

As will be appreciated by one skilled in the art, the present invention may be embodied as a method, system, or computer program product. Accordingly, embodiments of the invention may be implemented entirely in hardware, entirely in software (including firmware, resident software, microcode, etc.) or in an embodiment combining software and hardware. These various embodiments may all generally be referred to herein as a "circuit," "module," or "system." Furthermore, the present invention may take the form of a computer program product on a computer-usable storage medium having computer-usable program code embodied in the medium.

Any suitable computer usable or computer readable medium may be utilized. The computer-usable or computer-readable medium may be, for example, but not limited to, an electronic, magnetic, optical, electromagnetic, infrared, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, or a magnetic storage device. In the context of this document, a computer-usable or computer-readable medium may be any medium that can contain, store, communicate, or transport the program for use by or in connection with the instruction execution system, apparatus, or device.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

Embodiments of the invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A computer-implementable method for process optimization by a special purpose computer in a complex manufacturing operation, comprising:
    providing a memory comprising an operating system and a graph theory manufacturing operation representation portion;
    identifying, by a special purpose computer using instructions comprised in the memory, manufacturing units of a manufacturing operation, the manufacturing units comprising manufacturing components and manufacturing operations;
    characterizing, by the special purpose computer using the instructions comprised in the memory, the manufacturing units as nodes for inclusion on a manufacturing operation graph representation;
    characterizing, by the special purpose computer using the instructions comprised in the memory, at least one of input materials, suppliers, parts, and other inputs into the manufacturing operation as nodes for inclusion on the manufacturing operation graph representation;
    characterizing, by the special purpose computer using the instructions comprised in the memory, manufacturing steps within the manufacturing operation as connections for inclusion on the manufacturing operation graph representation;
    generating, by the special purpose computer using the instructions comprised in the memory, the manufacturing operation graph representation using the characterized nodes and connections;
    measuring, by the special purpose computer using the instructions comprised in the memory, a quality characteristic of a batch associated with the manufacturing operation;
    identifying, by the special purpose computer using the instructions comprised in the memory, connections between the measured batch and an unmeasured batch associated with the manufacturing operation;
    computing, by the special purpose computer using the instructions comprised in the memory, and based on the manufacturing operation graph representation and the identified connections, a degree of connectedness between the measured batch and the unmeasured batch; and
    predicting, by the special purpose computer using the instructions comprised in the memory and based on the degree of connectedness, a quality characteristic of the unmeasured batch.

2. The method of claim 1, further comprising:
    performing graph analytics on the manufacturing operation graph representation.

3. The method of claim 2, wherein the measured batch comprises known bad batch.

4. The method of claim 2, further comprising:
    clustering, in a first cluster and by the special purpose computer using the instructions comprised in the memory, first batches associated with the manufacturing operation;
    clustering, in a second cluster and by the special purpose computer using the instructions comprised in the memory, second batches associated with the manufacturing operation;
    determining, by the special purpose computer using the instructions comprised in the memory, differences between the first cluster and the second cluster, based on common antecedent batches between the first cluster and the second cluster.

5. The method of claim 4, wherein the connections comprise at least one uni-directional connection, the uni-directional connection defining a workflow of the first batches.

6. The method of claim 5, wherein the connections comprise at least one bi-directional connection, the bi-directional connection defining a workflow of the second batches.

7. The method of claim 6, wherein the connections identify relationships of the manufacturing items through upstream nodes and downstream nodes.

8. The method of claim 7, wherein in response to determining the quality characteristic of the unmeasured batch does not meet a quality standard, the unmeasured batch is reused as an input material.

9. The method of claim 8, wherein the graph analytics are used to determine a centrality characteristic of the manufacturing operation graph representation.

10. The method of claim 8, wherein the manufacturing operation comprises a pharmaceutical manufacturing operation.

11. The method of claim 8, wherein the manufacturing operation comprises an information handling system manufacturing operation.

12. A special purpose computer system for process optimization in a complex manufacturing operation, the special purpose computer system comprising:
 a processor;
 a data bus coupled to the processor; and
 a non-transitory, computer-readable storage medium embodying computer program code, the non-transitory, computer-readable storage medium being coupled to the data bus, the computer-readable storage medium comprising an operating system and a graph theory manufacturing operation representation portion, the computer program code interacting with a plurality of computer operations and comprising instructions executable by the processor and configured for:
  identifying manufacturing units of a manufacturing operation;
  characterizing the manufacturing units as nodes for inclusion on a manufacturing operation graph representation;
  characterizing at least one of input materials, suppliers, parts, and other inputs into the manufacturing operation as nodes for inclusion on the manufacturing operation graph representation;
  characterizing manufacturing steps within the manufacturing operation as connections for inclusion on the manufacturing operation graph representation;
  generating the manufacturing operation graph representation using the characterized nodes and connections;
  measuring a quality characteristic of a batch associated with the manufacturing operation;
  identifying connections between the measured batch and an unmeasured batch associated with the manufacturing operation;
  computing, using the manufacturing operation graph representation, and based on the identified connections, a degree of connectedness between the measured batch and the unmeasured batch; and
  predicting, based on the degree of connectedness, a quality characteristic of the unmeasured batch.

13. The system of claim 12, wherein the instructions executable by the processor are further configured for:
 performing graph analytics on the manufacturing operation graph representation.

14. The system of claim 12, wherein the measured batch comprises a known bad batch.

15. The system of claim 12, wherein the instructions executable by the processor are further configured for:
 clustering, in a first cluster and by the special purpose computer using the instructions comprised in the memory, first batches associated with the manufacturing operation;
 clustering, in a second cluster and by the special purpose computer using the instructions comprised in the memory, second batches associated with the manufacturing operation;
 determining, by the special purpose computer using the instructions comprised in the memory, differences between the first cluster and the second cluster, based on common antecedent batches between the first cluster and the second cluster.

16. A non-transitory, computer-readable storage medium embodying computer program code for achieving process optimization in a complex manufacturing operation, the computer-readable storage medium comprising a graph theory manufacturing operation representation portion, the computer program code comprising computer executable instructions configured for:
 identifying manufacturing units of a manufacturing operation;
 characterizing the manufacturing units as nodes for inclusion on a manufacturing operation graph representation;
 characterizing at least one of input materials, suppliers, parts, and other inputs into the manufacturing operation as nodes for inclusion on the manufacturing operation graph representation;
 characterizing manufacturing steps within the manufacturing operation as connections for inclusion on the manufacturing operation graph representation;
 generating the manufacturing operation graph representation using the characterized nodes and connections;
 measuring a quality characteristic of a batch associated with the manufacturing operation;
 identifying connections between the measured batch and an unmeasured batch associated with the manufacturing operation;
 computing, using the manufacturing operation graph representation, and based on the identified connections, a degree of connectedness between the measured batch and the unmeasured batch; and
 predicting, based on the degree of connectedness, a quality characteristic of the unmeasured batch.

17. The non-transitory, computer-readable storage medium of claim 16, wherein the computer executable instructions are further configured for:
 performing graph analytics on the manufacturing operation graph representation.

18. The non-transitory, computer-readable storage medium of claim 16, wherein the measured batch comprises a known bad batch.

19. The non-transitory, computer-readable storage medium of claim 16, wherein the computer executable instructions are further configured for:
 clustering, in a first workflow and by the special purpose computer using the instructions comprised in the memory, first batches associated with the manufacturing operation;
 clustering, in a second workflow and by the special purpose computer using the instructions comprised in the memory, second batches associated with the manufacturing operation;
 determining, by the special purpose computer using the instructions comprised in the memory, differences between the first cluster and the second cluster, based on common antecedent batches between the first cluster and the second cluster.

* * * * *